United States Patent [19]
Gardner et al.

[11] Patent Number: 5,959,333
[45] Date of Patent: Sep. 28, 1999

[54] REDUCTION OF DOPANT DIFFUSION BY THE CO-IMPLANTATION OF IMPURITIES INTO THE TRANSISTOR GATE CONDUCTOR

[75] Inventors: Mark I. Gardner, Cedar Creek; H. Jim Fulford; Derick J. Wristers, both of Austin, all of Tex.

[73] Assignee: Advanced Micro Devices, Inc.

[21] Appl. No.: 09/138,989

[22] Filed: Aug. 24, 1998

Related U.S. Application Data

[62] Division of application No. 08/865,883, May 30, 1997, Pat. No. 5,885,861.

[51] Int. Cl.⁶ .......................... H01L 29/76; H01L 29/94; H01L 31/062; H01L 31/113
[52] U.S. Cl. .......................... 257/372; 257/369; 257/607; 257/914
[58] Field of Search .................................. 257/369, 372, 257/607, 914

[56] References Cited

U.S. PATENT DOCUMENTS

| | | |
|---|---|---|
| 4,748,131 | 5/1988 | Zietlow. |
| 4,891,332 | 1/1990 | Bloem et al.. |
| 5,266,816 | 11/1993 | Seto et al. .................. 257/65 |
| 5,393,676 | 2/1995 | Anjum et al.. |
| 5,514,902 | 5/1996 | Kawasaki et al. .............. 257/607 |
| 5,567,638 | 10/1996 | Lin et al. .................. 438/592 |
| 5,585,286 | 12/1996 | Aronowitz et al.. |
| 5,633,177 | 5/1997 | Anjum .................. 438/301 |
| 5,712,181 | 1/1998 | Byun et al. .................. 438/592 |
| 5,753,548 | 5/1998 | Yu et al. .................. 438/231 |

*Primary Examiner*—Ngân V. Ngô
*Attorney, Agent, or Firm*—Kevin L. Daffer; Conley, Rose & Tayon

[57] ABSTRACT

Diffusion of dopants within the gate of the transistor and/or the source/drain regions can be inhibited by the ion co-implantation of impurities in addition to the ion implantation of the n-type or p-type dopants. Implanting a combination of nitrogen and carbon for p-type devices in addition to the p-type dopants and implanting a combination of nitrogen and fluorine for n-type devices in addition to the n-type dopants, significantly reduces the diffusion of the n-type and p-type dopants. The co-implantation of the additional impurities may be performed before patterning of the polysilicon layer to yield the gate conductors. The impurities may be implanted first, followed by the n-type or p-type dopants. Additional implantation of the impurities may be performed after the patterning of the polysilicon layer in order to reduce dopant diffusion in the source and drain regions. The ion implantation of the gate conductors and source/drain regions may performed at the same time following the patterning of the polysilicon layer.

8 Claims, 2 Drawing Sheets

5,959,333

REDUCTION OF DOPANT DIFFUSION BY THE CO-IMPLANTATION OF IMPURITIES INTO THE TRANSISTOR GATE CONDUCTOR

This is a Division of application Ser. No. 08/865,883, filed May 30, 1997, now U.S. Pat. No. 5,885,861.

BACKGROUND OF THE INVENTION

1. Field of the Invention

This invention relates to the field of semiconductor processing and, more particularly, to a transistor and method of making same with reduced dopant diffusion.

2. Description of Relevant Art

Fabrication of a metal-oxide-semiconductor ("MOS") transistor is well-known. Fabrication typically begins by introducing n-type or p-type impurities into a single-crystal silicon substrate. The active regions of the substrate (where the transistors will be formed) are then isolated from each other using isolation structures. In modern fabrication technologies, the isolation structures may comprise shallow trenches in the substrate filled with a dielectric such as oxide which acts as an insulator. Isolation structures may alternatively comprise, for example, locally oxidized silicon ("LOCOS") structures. A gate dielectric is then formed by oxidizing the silicon substrate. Oxidation is generally performed in a thermal oxidation furnace or, alternatively, in a rapid-thermal-anneal ("RTA") apparatus. A gate conductor is then patterned using a photolithography/etch process from a layer of polycrystalline silicon ("polysilicon") deposited upon the gate dielectric. The photolithography process allows selective removal of a photoresist film deposited entirely across the polysilicon. The portion of the photoresist film that is exposed can, according to one embodiment, be polymerized, and that which is not exposed removed during the "develop" stage of the lithography process. The regions that are non-polymerized form a mask for a subsequent etch during which portions of the polysilicon layer that are not masked by the photoresist pattern are removed. After the etch process, the patterned photoresist layer is stripped away.

The polysilicon is typically rendered conductive with the introduction of ions from an implanter or a diffusion furnace. Subsequently, source and drain regions are doped with a high-dose n-type or p-type dopant. If the source and drain regions are doped n-type, the transistor is referred to as NMOS, and if the source and drain regions are doped p-type, the transistor is referred to as PMOS. A channel region between the source and the drain is protected from the implant species by the pre-existing gate conductor. When an appropriate bias is applied to the gate of an enhancement-mode transistor, a conductive channel between the source and drain is induced and the transistor turns on.

As transistor geometries shrink below 1 micron, the limitations of conventional transistor processing become more and more apparent. As the thickness of the gate oxide decreases below 100 angstroms, devices become more susceptible to diffusion of impurities contained within the gate structure across the gate oxide and into the active area of the transistor. This problem is especially acute for gate structures into which boron is implanted. In addition, it is believed that many loosely formed bonds exist at the interface between the gate oxide and the polysilicon gate structure in conventionally formed transistors. The presence of these loosely formed bonds is believed to contribute to undesirable transistor characteristics such as susceptibility to voltage breakdown. Still further, as devices become smaller and more densely packed upon a semiconductor substrate surface, it becomes increasingly important to minimize the leakage current of each individual transistor. It is believed that leakage current can be created by a scattering effect that occurs as electrons traverse the channel between a device's source region and drain region. As the number of transistor devices within a single integrated circuit increases, leakage current can become significant enough to raise the temperature of the semiconductor substrate thereby slowing the device and, eventually, raising the temperature above the operational limit of the device. In addition, the presence of impurities in the channel of the device may cause a significant change in the threshold voltage. If the change brings the threshold outside the specification limits, the device is considered non-functional.

Therefore, it would be highly desirable to fabricate MOS transistors in a manner that reduced or eliminated diffusion from the gate transistor structure to the underlying active region of the transistor, improved the bond structure of the polysilicon-gate oxide interface, increased the source/drain drive current without a corresponding increase in leakage current, and prevented a significant change in the threshold voltage.

SUMMARY OF THE INVENTION

The problems identified above are in large part addressed by a semiconductor process in which the gates are co-implanted with specific impurities to improve the barrier characteristics of the gate. Diffusion of dopants into the gate of the transistor and/or the source/drain regions can be inhibited by the ion co-implantation of impurities in addition to the ion implantation of the n-type or p-type dopants. It is theorized that implanting a combination of nitrogen and carbon for p-type devices in addition to the p-type dopants and implanting a combination of nitrogen and fluorine for n-type devices in addition to the n-type dopants significantly reduces the diffusion of the n-type and p-type dopants. The co-implantation of the additional impurities may be performed before patterning of the polysilicon layer to form the gate conductors. The impurities may be implanted first followed by the n-type or p-type dopants. Additional implantation of the impurities may be performed after the patterning of the polysilicon layer in order to reduce dopant diffusion in the source and drain regions. The ion implantation of the gate conductors and source/drain regions may performed at the same time following the patterning of the polysilicon layer.

Broadly speaking, the present invention contemplates a method for fabricating an integrated circuit. A semiconductor substrate is provided comprising an NMOS region and a PMOS region. The NMOS region and the PMOS region are laterally displaced about an isolation structure. A gate dielectric is formed on an upper surface of the semiconductor substrate. An NMOS gate conductor is formed in the NMOS region and a PMOS gate conductor is formed in the PMOS region. Both the NMOS and the PMOS gate conductors are formed above the gate dielectric. Nitrogen is introduced into the NMOS gate conductor and into the PMOS conductor. Fluorine is then selectively introduced into the NMOS gate conductor followed by an n-type dopant. Carbon is selectively introduced into the PMOS gate conductor followed by a p-type dopant. N-type dopants are then introduced into the NMOS region of the semiconductor substrate to form NMOS source/drain regions and a p-type dopant are introduced into the PMOS region of the semiconductor substrate to form PMOS source/drain regions.

Prior to introducing the n-type dopants into the NMOS source/drain regions and prior to introducing the p-type dopants into the PMOS source/drain regions nitrogen may be introduced into the NMOS source/drain regions and into the PMOS source/drain regions. Fluorine may be selectively introduced into the NMOS source/drain regions and carbon may be selectively introduced into the PMOS source/drain regions.

In one embodiment, the semiconductor substrate preferably comprises a lightly-doped epitaxial layer of single-crystalline silicon. The isolation structure preferably comprises a trench void created by selectively etching the semiconductor substrate and TEOS deposited by CVD into the trench void. The step of forming the gate dielectric preferably comprises thermally oxidizing the semiconductor substrate to a thickness of approximately 15–50 Å. The step of forming the gate dielectric is preferably performed in a rapid thermal anneal apparatus. The NMOS gate conductor and the PMOS gate conductor preferably comprises polycrystalline silicon. The steps of introducing nitrogen, fluorine, carbon, n-type dopants, and p-type dopants preferably comprises introduction of the species with ion implantation. The n-type dopants preferably comprise phosphorus or arsenic impurities and the p-type dopants preferably comprise boron impurities.

The present invention further contemplates an integrated circuit comprising a semiconductor substrate. The semiconductor substrate comprises an NMOS region and a PMOS region and wherein the NMOS region and the PMOS region are laterally disposed on either side of an isolation structure. A gate dielectric is on an upper surface of the semiconductor substrate. An NMOS gate conductor is located in the NMOS region and comprises nitrogen, fluorine, and n-type dopants. A PMOS gate conductor is located in the PMOS region and comprises nitrogen, carbon, and p-type dopants. NMOS source/drain regions are located in the NMOS region and comprise n-type dopants. PMOS source/drain regions are located in the PMOS region and comprise p-type dopants.

The NMOS source/drain regions further comprise nitrogen and fluorine impurities. The PMOS source/drain regions further comprise carbon and fluorine impurities. The semiconductor substrate comprises lightly doped, epitaxial, single-crystalline silicon. The isolation structure comprises a trench void created by selectively etching the semiconductor substrate and TEOS deposited by CVD into the trench void.

The gate dielectric has a thickness of approximately 15–50 Å. The NMOS gate conductor and the PMOS gate conductor comprise polycrystalline silicon. The n-type dopants comprise phosphorus or arsenic. The p-type dopants comprise boron.

BRIEF DESCRIPTION OF THE DRAWINGS

Other objects and advantages of the invention will become apparent upon reading the following detailed description and upon reference to the accompanying drawings in which.

Figure 1:
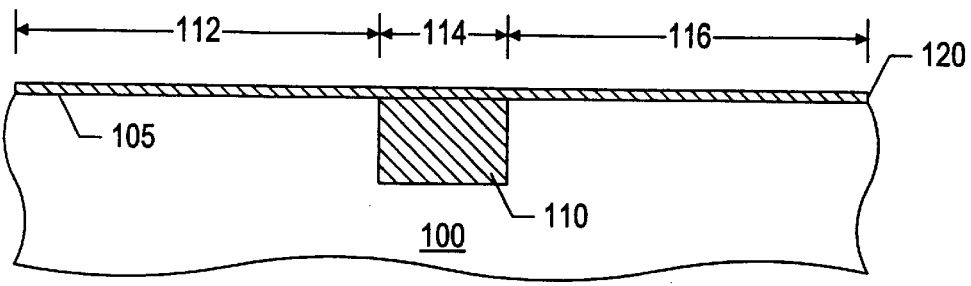
FIG. 1 is a partial cross-sectional view of a semiconductor substrate showing an isolation structure and a thin layer of gate oxide upon the upper surface of the semiconductor.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the figures, FIG. 1 shows a partial cross-sectional view of semiconductor substrate 100 with upper surface 105. Semiconductor substrate 100 preferably comprises an epitaxial layer of lightly doped n-type of p-type single-crystalline silicon. This lightly-doped epitaxial layer is formed upon a heavily-doped single-crystalline silicon. Isolation structure 110 is etched into upper surface 105 to create field region 114. Field region 114 electrically isolates active regions 112 and 116 from one another and from other active regions on the substrate. Active region 112 is where PMOS type devices will be subsequently formed, and active region 116 is where NMOS type devices will be subsequently formed.

In a preferred embodiment, isolation structure 110 comprises a shallow trench isolation structure. The formation of shallow trench 110 is typically accomplished by first anisotropically etching a trench-shaped void into semiconductor substrate 110 and then depositing a dielectric such as TEOS into the trench-shaped void. Any dielectric deposited exterior to the trench is removed, preferably with a chemical-mechanical polish, to result in planar upper surface. In an alternative embodiment, isolation structure 110 may comprise LOCOS type of structures. LOCOS structures are typically formed by oxidizing semiconductor substrate 100 in the presence of an oxidation inhibiting mask such as a patterned silicon nitride layer. LOCOS structures, however, result in a non-planar upper surface which is undesirable. In addition, the LOCOS structures include a "bird's beak" which undesirably encroaches upon active regions 112 and 116 of semiconductor substrate 100.

Subsequently, gate dielectric 120 is formed upon upper surface 105 of the semiconductor substrate 100 and the upper surface of the isolation structure. In a preferred embodiment, gate dielectric 120 comprises silicon dioxide formed by a thermal oxidation process. The thermal oxidation is preferably performed in a thermal oxidation furnace at temperatures of approximately 700–1000° C. or, alternatively, in a rapid thermal anneal apparatus. In a rapid thermal anneal apparatus, semiconductor substrate 100 is subjected to a temperature of approximately 700–1000° C.

for a relatively short time (typically less than 20 minutes). The thickness of gate dielectric 120 is preferably between 15 and 50 Å.

Figure 2:
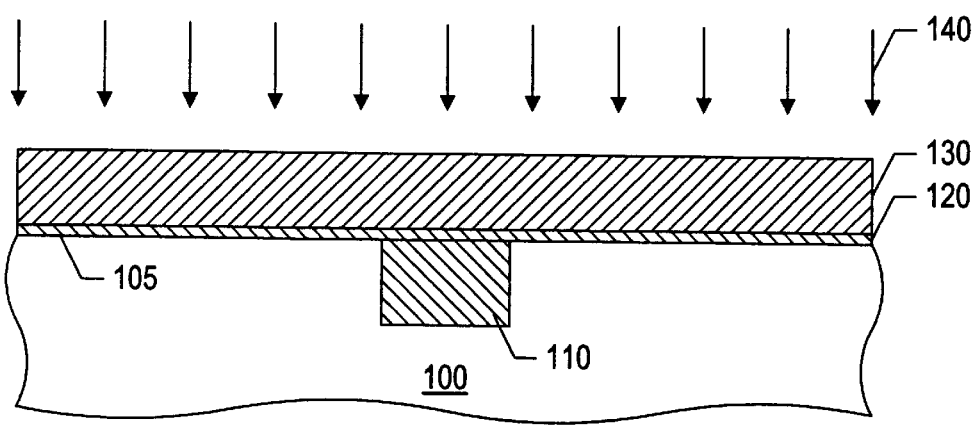
FIG. 2 is a partial cross-sectional view of a semiconductor substrate according to a processing step subsequent to FIG. 1 showing ion implantation of a deposited polysilicon layer with nitrogen.

Turning now to FIG. 2, gate conductive layer 130 is deposited upon gate dielectric 120. In a preferred embodiment, a low-pressure (i.e., less than approximately 2 torrs) chemical-vapor deposition process is used to deposit a layer of amorphous polycrystalline silicon (polysilicon). Nitrogen impurities 140 are subsequently introduced into conductive layer 130. In a preferred embodiment, nitrogen impurities 140 are introduced into conductive layer 130 by ion implantation. The presence of nitrogen inhibits diffusion of the subsequently introduced dopants. The dopants are introduced to render the polysilicon conductive. As mentioned earlier, if the dopants in the gate conductor diffuse beyond the gate conductor and into the gate dielectric and channel of the transistor, the threshold voltage of the transistor is altered. In an alternative embodiment, the introduction of nitrogen impurities 140 may be delayed until after the formation of the gate conductors. The nitrogen impurities may then be introduced into the gate conductors and the source/drain regions. In addition to preventing dopant diffusion from occurring within the gate conductors, dopant diffusion is also prevented from occurring within the source/drain regions.

Figure 3:
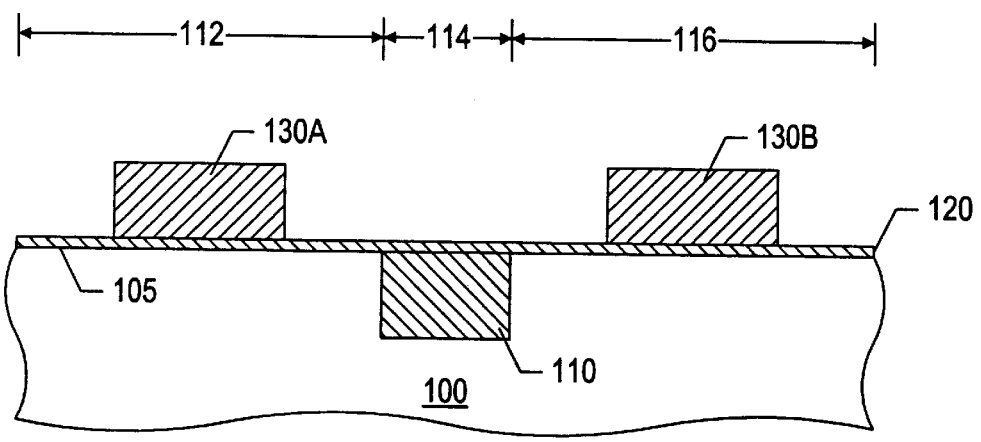
FIG. 3 is a partial cross-sectional view of a semiconductor substrate according to a processing step subsequent to FIG. 2 showing patterning of the polysilicon into two gate conductors.

Turning now to FIG. 3, gate conductive layer 130 is selectively patterned to produce gate conductor 130A and gate conductor 130B. In a preferred embodiment, a layer of photoresist is deposited upon gate conductive layer 130 and then selectively exposed to radiation using a mask. After development, an anisotropic etch is used to partially remove gate conductive layer 130 and form gate conductor 130A and gate conductor 130B. Gate conductor 130A is formed in active region 112 as part of a p-type transistor. Gate conductor 130B is formed in active region 116 as part of an n-type transistor.

Figure 4:
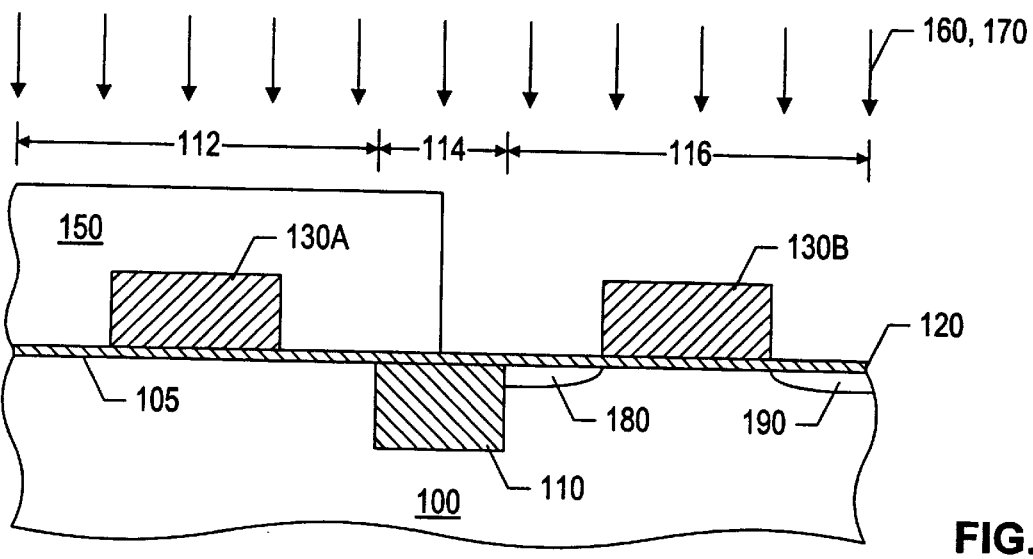
FIG. 4 is a partial cross-sectional view of a semiconductor substrate according to a processing step subsequent to FIG. 3 showing selective ion implantation of the NMOS portion of the semiconductor substrate with fluorine and an n-type dopant.

Turning now to FIG. 4, photoresist layer 150 is deposited upon the semiconductor topography. Photoresist layer 150 is patterned in such a way as to cover active area 112 and leave active area 116 exposed. Active region 116 is the region where an n-type transistor is to be formed. Fluorine impurities 160 are then introduced into gate conductor 130B and source/drain regions 180 and 190. It is theorized that the presence of fluorine in addition to the presence of nitrogen, further reduces the damaging diffusion of the subsequently deposited n-type dopants. An optional thermal anneal may be performed in order to diffuse and activate the nitrogen and fluorine prior to the introduction of n-type dopants. N-type dopants 170 are subsequently introduced into gate conductor 130B and source/drain regions 180 and 190. The introduction of n-type dopants into gate conductor 130B renders the gate conductor conductive. In a preferred embodiment, n-type dopants 170 comprise phosphorus or arsenic impurities. Fluorine impurities 160 and n-type dopants 170 are preferably introduced into gate conductor 130B and source/drain regions 180 and 190 with ion implantation. After all ion implantations have been performed, the remaining of photoresist layer 150 is completely removed. A thermal anneal may be performed in order to diffuse and activate the nitrogen, fluorine, and n-type dopants.

Figure 5:
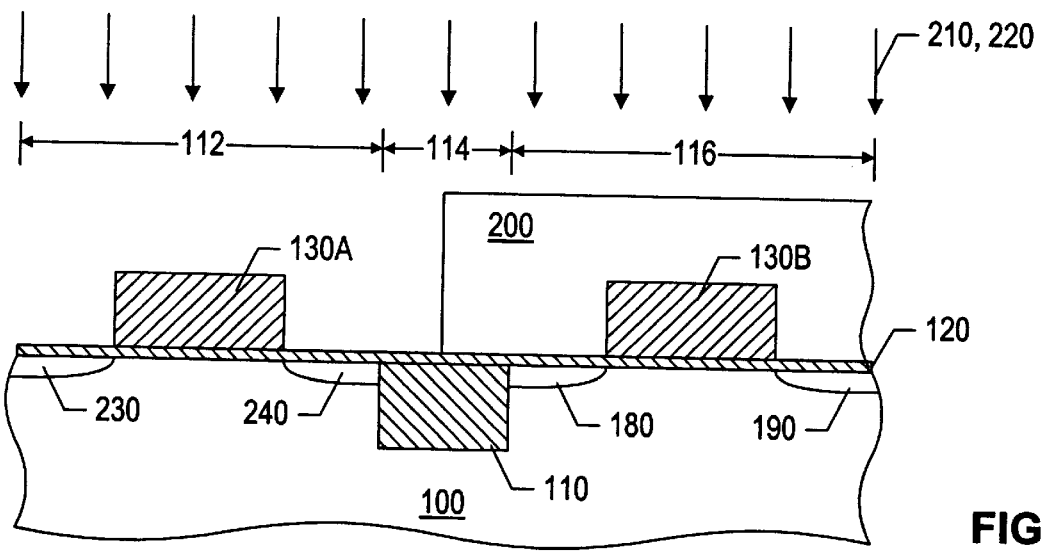
FIG. 5 is a partial cross-sectional view of a semiconductor substrate according to a processing step subsequent to FIG. 4 showing selective ion implantation of the PMOS portion of the semiconductor substrate with carbon and a p-type dopant.

Turning now to FIG. 5, photoresist layer 200 is deposited upon the semiconductor topography. Photoresist layer 200 is patterned in such a way as to cover active area 116 and leave active area 112 exposed. Active region 112 is the region where a p-type transistor is to be formed. Carbon impurities 210 are then introduced into gate conductor 130A and source/drain regions 230 and 240. It is theorized that the presence of carbon in addition to the presence of nitrogen, further reduces the damaging diffusion of the subsequently deposited p-type dopants. An optional thermal anneal may be performed in order to diffuse and activate the nitrogen and carbon prior to the introduction of n-type dopants. P-type dopants 220 are subsequently introduced into gate conductor 130A and source/drain regions 230 and 240. The introduction of p-type dopants into gate conductor 130A renders the gate conductor conductive. In a preferred embodiment, p-type dopants 170 comprise boron impurities. Carbon impurities 210 and p-type dopants 220 are preferably introduced into gate conductor 130A and source/drain regions 180 and 190 with ion implantation. After all ion implantations have been performed, the remaining of photoresist layer 150 is completely removed. A thermal anneal may be performed in order to diffuse and activate the nitrogen, carbon, and p-type dopants.

Figure 6:
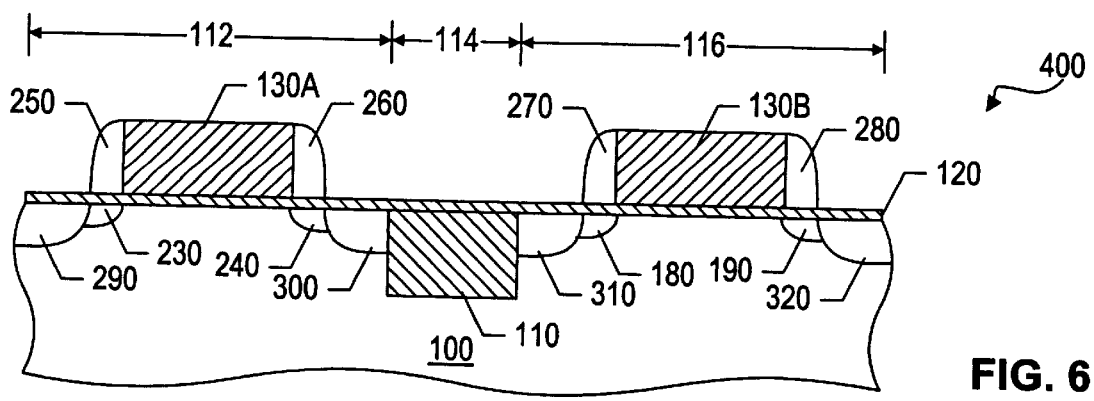
FIG. 6 is a partial cross-sectional view of a semiconductor showing a semiconductor circuit formed in accordance with the present invention.

Turning now to FIG. 6, a partial cross-sectional view of integrated circuit 400 is shown. Semiconductor substrate 100 is divided into NMOS active region 116 and PMOS active region 112 by isolation structure 110. Isolation structure 110 defines field region 114. Gate dielectric layer 120 is formed on the upper surface of semiconductor substrate 100. PMOS gate conductor 130A is located in PMOS region 112, and NMOS gate conductor 130B is located in NMOS region 130B. PMOS gate conductor 130A comprises nitrogen, carbon, and p-type dopants. The p-type dopants may be, for example, boron. NMOS gate conductor 130B comprises nitrogen, fluorine, and n-type dopants. The n-type dopants may be, for example, phosphorus or arsenic.

P-type source/drain regions 290, 230, 240, and 300 are located in active region 112, close to the upper surface of semiconductor substrate 100, and disposed on either side of PMOS gate conductor 130A. Source/drain regions 290, 230, 240, and 300 comprise nitrogen, carbon, and p-type dopants. For better transistor performance, the source/drain regions comprise lightly-doped regions 230 and 240 and heavily-doped regions 290 and 300. Formation of heavily-doped regions 290 and 300 is accomplished by the masking effect of spacers 250 and 260 located along the sidewall surfaces of PMOS gate conductor 130A.

N-type source/drain regions 310, 180, 190, and 320 are located in active region 116, close to the upper surface of semiconductor substrate 100, and disposed on either side of NMOS gate conductor 130B. Source/drain regions 310, 180, 190, and 320 comprise nitrogen, fluorine, and n-type dopants. For better transistor performance, the source/drain regions comprise lightly-doped regions 180 and 190 and heavily-doped regions 310 and 320. Formation of heavily-doped regions 290 and 300 is accomplished by the masking effect of spacers 270 and 280 located along the sidewall surfaces of NMOS gate conductor 130B.

It will be appreciated to those skilled in the art having the benefit of this disclosure that this invention is believed to be capable of reducing dopant diffusion into the gate conductor of MOS transistors. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. An integrated circuit comprising:
   a first gate conductor dielectrically spaced above a semiconductor substrate, wherein the first gate conductor comprises nitrogen, fluorine and n-type dopants; and a second gate conductor dielectrically spaced above the semiconductor substrate a lateral distance from the first gate conductor, wherein the second gate conductor comprises nitrogen, carbon and p-type dopants.

2. The integrated circuit as recited in claim 1, wherein the first gate conductor is dielectrically spaced above a region of the semiconductor substrate which resides between a first pair of source/drain regions, and wherein the first pair of source drain regions comprise fluorine and n-type dopants.

3. The integrated circuit as recited in claim 1, wherein the second gate conductor is dielectrically spaced above a region of the semiconductor substrate which resides between a second pair of source/drain regions, and wherein the second pair of source drain regions comprise carbon and p-type dopants.

4. The integrated circuit as recited in claim 1, wherein the first gate conductor is dielectrically spaced above a region of the semiconductor substrate which resides between a first pair of source/drain regions, and wherein the first pair of source drain regions comprise nitrogen and n-type dopants.

5. The integrated circuit as recited in claim 1, wherein the second gate conductor is dielectrically spaced above a region of the semiconductor substrate which resides between a second pair of source/drain regions, and wherein the second pair of source drain regions comprise nitrogen and p-type dopants.

6. The integrated circuit as recited in claim 1, wherein said semiconductor substrate comprises lightly doped, epitaxial, single-crystalline silicon.

7. The integrated circuit as recited in claim 1, wherein said first and second gate conductors are laterally separated from each other by an isolation structure comprising a dielectric-filled trench.

8. The integrated circuit as recited in claim 1, wherein said first and second gate conductors are dielectrically spaced above the semiconductor substrate by a gate dielectric having a thickness of approximately 15–50 Å.

* * * * *